United States Patent
Huang et al.

(10) Patent No.: US 11,862,276 B2
(45) Date of Patent: Jan. 2, 2024

(54) MEMORY TEST METHOD AND MEMORY TEST APPARATUS

(71) Applicant: CHANGXIN MEMORY TECHNOLOGIES, INC., Hefei (CN)

(72) Inventors: Wei Huang, Hefei (CN); Chi-Shian Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/659,336

(22) Filed: Apr. 15, 2022

(65) Prior Publication Data
US 2023/0092554 A1 Mar. 23, 2023

(30) Foreign Application Priority Data
Sep. 22, 2021 (CN) .......................... 202111106307.6

(51) Int. Cl.
*G11C 29/12* (2006.01)
*G11C 29/46* (2006.01)
*G11C 29/36* (2006.01)

(52) U.S. Cl.
CPC .......... *G11C 29/46* (2013.01); *G11C 29/1201* (2013.01); *G11C 29/36* (2013.01); *G11C 2029/1202* (2013.01); *G11C 2029/3602* (2013.01)

(58) Field of Classification Search
CPC ..... G11C 29/46; G11C 29/1201; G11C 29/36; G11C 2029/1202; G11C 2029/3602; G11C 29/56
See application file for complete search history.

(56) References Cited

U.S. PATENT DOCUMENTS

| | | | |
|---|---|---|---|
| 7,184,333 B2 | 2/2007 | Yamada et al. | |
| 8,934,311 B2 | 1/2015 | Yu et al. | |
| 9,123,447 B2 | 9/2015 | Lee et al. | |

(Continued)

FOREIGN PATENT DOCUMENTS

| | | |
|---|---|---|
| CN | 1700356 A | 11/2005 |
| CN | 102982848 A | 3/2013 |

(Continued)

OTHER PUBLICATIONS

First CN Office Action cited in CN202111106307.6 dated May 25, 2023, 9 pages.

*Primary Examiner* — Mohammed A Bashar
(74) *Attorney, Agent, or Firm* — Cooper Legal Group, LLC

(57) ABSTRACT

The present application relates to the technical field of integrated circuits, and in particular, to a memory test method and a memory test apparatus. The memory test method includes: providing a to-be-tested memory, where the to-be-tested memory includes a plurality of memory cells; alternately writing a first write value and a second write value into a memory cell of the memory cells at a preset frequency; writing a test write value into the memory cell; judging whether a data read from the memory cell is the test write value, and determining that a capacitance-frequency characteristic of the memory cell is abnormal if the data is not the test write value. According to the present application, the capacitance-frequency characteristic of the to-be-tested memory is accurately tested, to improve the field of memory products.

13 Claims, 2 Drawing Sheets

(56) References Cited

U.S. PATENT DOCUMENTS

| | | | |
|---|---|---|---|
| 2001/0009022 A1 | 7/2001 | Feierbach | |
| 2002/0040454 A1 | 4/2002 | Raad et al. | |
| 2015/0043292 A1* | 2/2015 | Lee | G11C 29/50012 365/201 |
| 2017/0270994 A1* | 9/2017 | Glancy | G11C 29/028 |
| 2021/0096760 A1* | 4/2021 | Cho | G06F 3/0679 |

FOREIGN PATENT DOCUMENTS

| | | |
|---|---|---|
| CN | 104347108 A | 2/2015 |
| CN | 112927750 A | 6/2021 |
| CN | 113160876 A | 7/2021 |
| JP | H11283397 A | 10/1999 |

* cited by examiner

MEMORY TEST METHOD AND MEMORY TEST APPARATUS

CROSS-REFERENCE TO RELATED APPLICATIONS

This application claims the priority of Chinese Patent Application No. 202111106307.6, submitted to the Chinese Intellectual Property Office on Sep. 22, 2021, the disclosure of which is incorporated herein in its entirety by reference.

TECHNICAL FIELD

The present application relates to the technical field of integrated circuits, and in particular, to a memory test method and a memory test apparatus.

BACKGROUND

As a semiconductor device commonly used in an electronic device such as a computer, a dynamic random access memory (DRAM) includes a plurality of memory cells, and each memory cell usually includes a transistor and a capacitor. The transistor has a gate being electrically connected to a word line, a source being electrically connected to a bit line, and a drain being electrically connected to the capacitor. A word line voltage on the word line can control on and off of the transistor, such that data information stored in the capacitor can be read through the bit line or data information can be written into the capacitor through the bit line. In the memory, a capacitance of the capacitor has a frequency characteristic, that is, the capacitance of the capacitor decreases with the increase of frequency. Therefore, there is a possibility of failure of a capacitance-frequency characteristic during use of the memory. However, currently, there is no effective method to test the capacitance-frequency characteristic of the memory. Consequently, a memory cell with a poor capacitance-frequency characteristic cannot be repaired in time, resulting in poor quality of the memory.

Therefore, how to effectively test the capacitance-frequency characteristic of the memory to improve the yield of memory is an urgent technical problem to be resolved.

SUMMARY

According to some embodiments, the present application provides a memory test method, including:
providing a to-be-tested memory, where the to-be-tested memory includes a plurality of memory cells;
alternately writing a first write value and a second write value into a memory cell of the memory cells at a preset frequency;
writing a test write value into the memory cell; and
judging whether a data read from the memory cell is the test write value, and determining that a capacitance-frequency characteristic of the memory cell is abnormal if the data is not the test write value.

According to some other embodiments, the present application further provides a memory test apparatus, including:
a test circuit, configured to alternately write a first write value and a second write value into a memory cell of a to-be-tested memory at a preset frequency;
a write circuit, configured to write a test write value into the memory cell;
a read circuit, configured to read a data from the memory cell; and
a processor, configured to judge whether the data read from the memory cell is the test write value and determine that a capacitance-frequency characteristic of the memory cell is abnormal if the data is not the test write value.

DETAILED DESCRIPTION

Some embodiments of a memory test method and a memory test apparatus provided by the present application are described in detail below with reference to the accompanying drawings.

Figure 1:
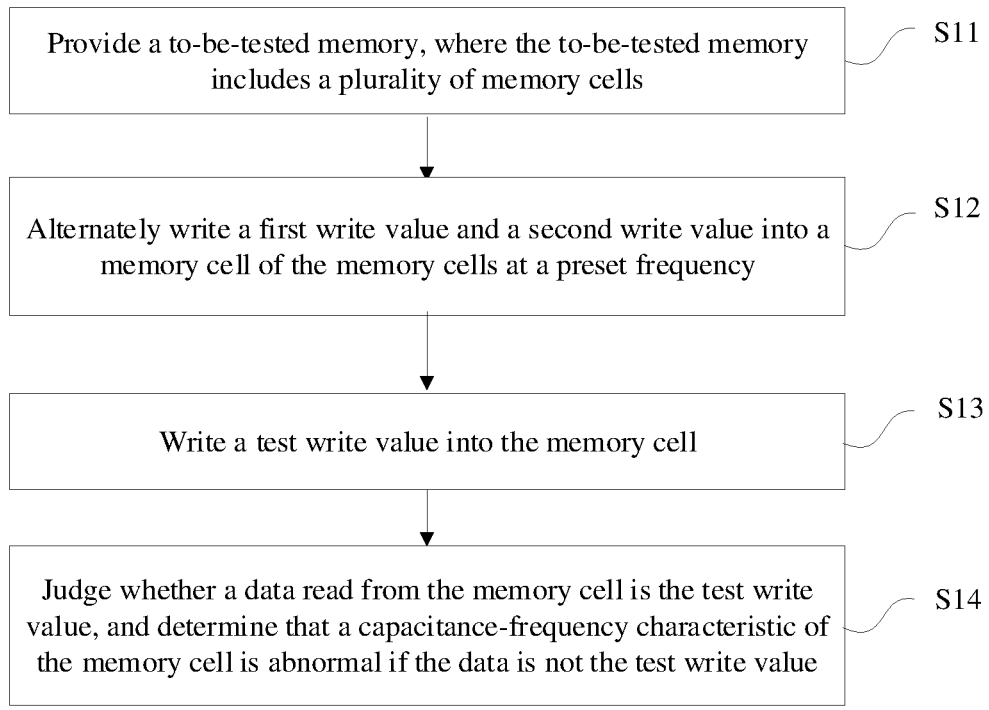
FIG. 1 is a flowchart of a memory test method according to a specific implementation of the present application.
Figure 2:
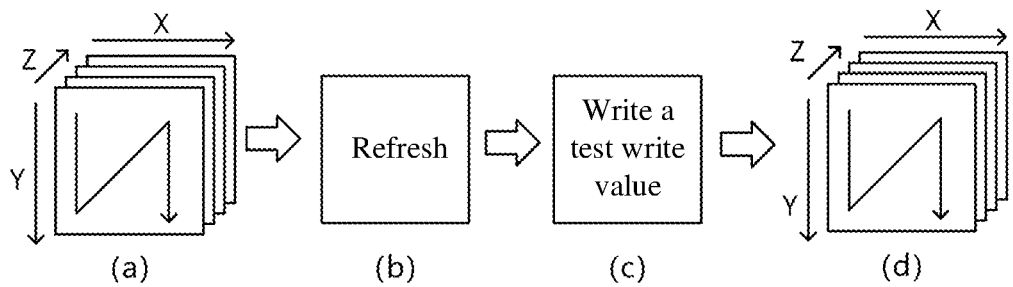
FIG. 2 is a schematic diagram of a process of testing a to-be-tested memory according to a specific implementation of the present application.

This specific implementation provides a memory test method. FIG. 1 is a flowchart of a memory test method according to a specific implementation of the present application. FIG. 2 is a schematic diagram of a process of testing a to-be-tested memory according to a specific implementation of the present application. As shown in FIG. 1 and FIG. 2, the memory test method includes.

Step S11. Provide a to-be-tested memory, where the to-be-tested memory includes a plurality of memory cells.

In some embodiments, the to-be-tested memory may be, but not limited to, a dynamic random-access memory (DRAM). An example in which the to-be-tested memory is the DRAM is used for description. The to-be-tested memory includes a plurality of memory cells, and the plurality of memory cells are arranged in an array, to form a memory array. The memory cell includes a capacitor. When a write operation is performed on the to-be-tested memory, different write values are written into the memory cell by adjusting magnitudes of voltages applied on an upper plate and a bottom plate of the capacitor. In this specific implementation, "a plurality of" means two or more.

Step S12. Alternately write a first write value and a second write value into a memory cell of the memory cell at a preset frequency.

In some embodiments, the to-be-tested memory further includes a word line and a bit line that both are electrically connected to the memory cell; and the alternately writing a first write value and a second write value into a memory cell of the memory cells at a preset frequency includes:
opening the word line; and
alternately writing the first write value and the second write value into the memory cell from the bit line at the preset frequency.

In some embodiments, the alternately writing a first write value and a second write value into a memory cell of the memory cells at a preset frequency includes:
performing the following first cyclic step for a plurality of times:
writing the first write value into the memory cell;
writing the second write value into the memory cell, after delaying a preset time from a completion of writing of the first write value; and performing the next first cyclic step after delaying a preset time from a completion of writing of the second write value.

In some embodiments, the first write value and the second write value may be alternately written into the memory cell from the bit line at the preset frequency by adjusting a timing tCCD (a time interval between two adjacent column address strobes). For example, the first write value is 1 and the second write value is 0. The specific step of alternately writing a first write value and a second write value into the memory cell at a preset frequency includes: first opening the word line electrically connected to the memory cell; then writing 1 into the memory cell by using the bit line; writing 0 into the memory cell by using the bit line after 1 is written into the memory cell and the preset time is delayed; and writing 1 into the memory cell by using the bit line again after 0 is written into the memory cell and the preset time is delayed, and so on. 1 and 0 are alternately written into the same memory cell, and a time interval (that is, a time interval between two adjacent bit line pulses) between two adjacent write operations is the preset time.

In this specific implementation, two different write values are alternately written into the same memory cell, to cause high-frequency conversion between voltages on two plates (that is, the upper plate and the lower plate) of the capacitor inside the memory cell, thereby testing the capacitance-frequency characteristic of the memory cell.

Step S13. Write a test write value into the memory cell.

Step S14. Determine whether data read from the memory cell is the test write value, and determine that a capacitance-frequency characteristic of the memory cell is abnormal if the data is not the test write value.

In some embodiments, after a plurality of times of operations of alternately writing the first write value and the second write value into the memory cell at the preset frequency are performed, the test write value is written into the memory cell. Subsequently, data in the memory cell is read. If the read data is the same as the test write value, it indicates that the memory cell does not fail when the first write value and the second write value are alternately written into the memory cell at the preset frequency, that is, it is determined that the capacitance-frequency characteristic of the memory cell is normal. If the read data is different from the test write value, it indicates that the memory cell fails when the first write value and the second write value are alternately written into the memory cell at the preset frequency, that is, it is determined that the capacitance-frequency characteristic of the memory cell is abnormal.

After it is determined that the capacitance-frequency characteristic of the memory cell is abnormal, the memory cell with the abnormal capacitance-frequency characteristic may be replaced with a redundant unit through a structure such as a fuse, to repair the to-be-tested memory in time, thereby improving the quality of the memory.

In some embodiments, the to-be-tested memory includes the plurality of memory cells, and the plurality of memory cells are arranged into a memory array. The memory test method further includes:

alternately writing the first write value and the second write value into each of the memory cells at the preset frequency;

writing the test write value into the entire memory array; and judging whether all data read from the memory array is the test write value, and determining that there is a memory cell with the abnormal capacitance-frequency characteristic in the memory array if the data is not the test write value.

For example, as shown in FIG. 2, the to-be-tested memory includes a plurality of memory arrays arranged in parallel in a Z-axis direction, and each memory array includes a plurality of memory cells arranged in a two-dimensional array in an X-axis direction and a Y-axis direction. The X-axis direction is an extending direction of a row of the memory array, and the Y-axis direction is an extending direction of a column of the memory array. The memory array includes a plurality of word lines extending in the X-axis direction and a plurality of bit lines extending in the Y-axis direction. The plurality of word lines are arranged in parallel in the Y-axis direction, and the plurality of bit lines are arranged in parallel in the X-axis direction. The specific step of alternately writing the first write value and the second write value into each of the memory cells at the preset frequency (that is, an operation (a) in FIG. 2) may include:

selecting one bit line from one memory array as a target bit line, and opening the target bit line;

performing a first repeat step on each of the plurality of word lines in the memory array; and closing the target bit line, and using a next bit line adjacent to the target bit line as a target bit line of a next first repeat step, where the first repeat step includes:

selecting one word line as a first target word line, and opening the first target word line;

alternately writing the first write value and the second write value from the target bit line at the preset frequency; and closing the first target word line after alternate writing is performed for a plurality of times, and using a next word line adjacent to the first target word line as a first target word line in a next first repeat step.

After the operation of alternately writing the first write value and the second write value at the preset frequency is performed on all the memory cells in the to-be-tested memory, a refreshing operation (that is, an operation (b) in FIG. 2) is performed on all the memory cells in the to-be-tested memory. Subsequently, the test write value is written into the entire to-be-tested memory (that is, an operation (c) in FIG. 2). Next, data in the to-be-tested memory is read (that is, an operation (d) in FIG. 2). Whether all data read from the memory array is the test write value is determined, and it is determined that there is a memory cell with the abnormal capacitance-frequency characteristic in the memory array if the data is not the test write value. The specific step of reading data in the to-be-tested memory includes:

performing a second repeat step for a plurality of times until all the memory cells in the memory array are read, where the second repeat step includes:

selecting one word line as a second target word line, and reading all memory cells connected to the second target word line; and using a next word line adjacent to the second target word line as a second target word line in a next second repeat step after all the memory cells connected to the second target word line are read.

In some embodiments, to detect an impact of a frequency on the capacitance-frequency characteristic of the memory cell, there are a plurality of preset frequencies and the plurality of preset frequencies are different from each other; and the memory test method further includes:

sequentially taking each of the preset frequencies as a current preset frequency, and performing the following second cyclic step at each current preset frequency:

alternately writing the first write value and the second write value into the memory cell at the current preset frequency;

writing the test write value into the memory cell; and judging whether the data read from the memory cell is the test write value, and determining that the capacitance-frequency characteristic of the memory cell is abnormal at the current preset frequency if the data is not the test write value.

In some embodiments, the preset frequency is 0.1 MHz to 15 MHz. For example, the preset frequency is 0.390625 MHz, 1.5625 MHz, 3.125 MHz, or 12.5 MHz.

In some embodiments, the plurality of preset frequencies that are different from each other are set, and the capacitance-frequency characteristic of the memory cell is tested at each preset frequency, so that a frequency range that easily causes failure of the memory cell or a frequency range that is tolerable to the memory cell may be determined, thereby repairing or improving the memory cell in a targeted manner. In this specific implementation, an objective of setting a plurality of preset frequencies that are different from each other may be achieved by adjusting tCCD. In other implementations, those skilled in the art may alternatively achieve an effect of adjusting the preset frequency in another manner according to actual needs.

In some embodiments, to detect an impact of a number of times of alternately writing on the capacitance-frequency characteristic of the memory cell, the memory test method further includes:

setting a plurality of preset number of times, where the plurality of preset number of times are different from each other; and sequentially taking each of the plurality of preset number of times as a current preset number of times, and performing the following third cyclic step for each current preset number of times:

alternately writing the first write value and the second write value into the memory cell at the preset frequency, where the number of times of alternately writing is the current preset number of times;

writing the test write value into the memory cell; and judging whether the data read from the memory cell is the test write value, and determining that the capacitance-frequency characteristic of the memory cell is abnormal under the current preset number of times if the data is not the test write value.

In some embodiments, the preset number of times is 3 times to 2000 times. For example, the preset number of times is 5 times, 10 times, 50 times, 100 times, 500 times, or 1000 times.

In some embodiments, the plurality of preset number of times that are different from each other are set, and the capacitance-frequency characteristic of the memory cell is tested for each of the plurality of preset number of times, so that a range of a preset number of times that easily causes failure of the memory cell or a use service life range of the memory cell may be determined, thereby repairing or improving the memory cell in a targeted manner.

In some embodiments, the test write value is 1. In some other embodiments, the test write value may alternatively be 0.

Figure 3:
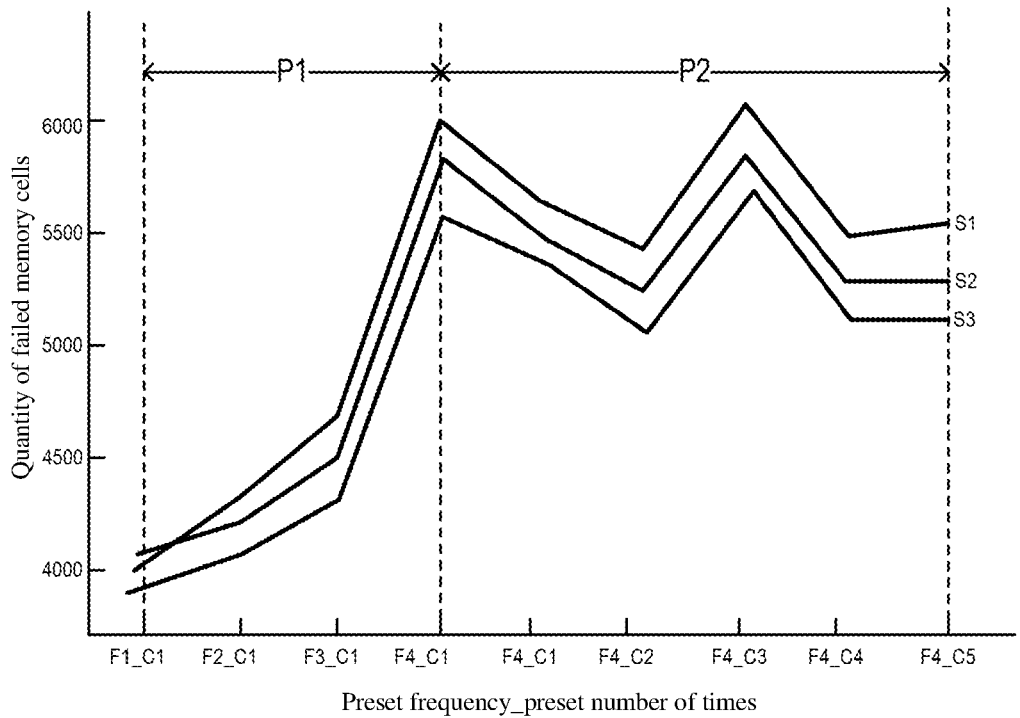
FIG. 3 is a schematic diagram of a testing result according to a specific implementation of the present application.

FIG. 3 is a schematic structure diagram of a testing result according a specific implementation of the present application. In FIG. 3, a horizontal coordinate is a preset frequency and a preset number of times, and a vertical coordinate is a quantity of failed memory cells. In FIG. 3, a first curve S1 represents a testing result of a capacitance-frequency characteristic of a first to-be-tested memory, a second curve S2 represents a testing result of a capacitance-frequency characteristic of a second to-be-tested memory, and a third curve S3 represents a testing result of a capacitance-frequency characteristic of a third to-be-tested memory. In FIG. 3, a first part P1 represents a relationship between a quantity of failed memory cells in a to-be-tested memory (including the first to-be-tested memory, the second to-be-tested memory, and the third to-be-tested memory) and the preset frequency when the preset number of times is fixed (all the preset number of times are C1). A first preset frequency F1<a second preset frequency F2<a third preset frequency F3<a fourth preset frequency F4. It can be seen that the quantity of failed memory cells in the to-be-tested memory increases with the increase of preset frequency In FIG. 3, a second part P2 presents a relationship between the quantity of failed memory cells in the to-be-tested memory (including the first to-be-tested memory, the second to-be-tested memory, and the third to-be-tested memory) and the preset number of times when the preset frequency is fixed (all the preset frequencies are F4). A first preset number of times C1>a second preset number of times C2>a third preset number of times C3>a fourth preset number of times C4>a fifth preset number of times C5.

Figure 4:
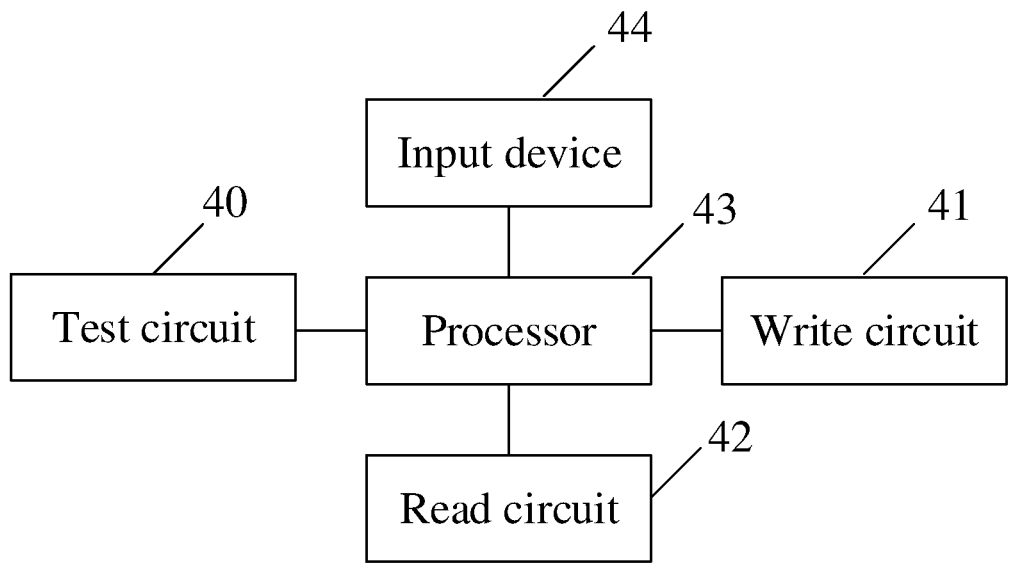
FIG. 4 is a structural block diagram of a memory test apparatus according to a specific implementation of the present application.

According to some other embodiments, the present application further provides a memory test apparatus. FIG. 4 is a structural block diagram of a memory test apparatus according to a specific implementation of the present application. The memory test apparatus provided in this specific implementation may be tested by using the memory test method shown in FIG. 1 to FIG. 3. As shown in FIG. 4, the memory test apparatus includes:

a test circuit 40, configured to alternately write a first write value and a second write value into a memory cell of a to-be-tested memory at a preset frequency;

a write circuit 41, configured to write a test write value into the memory cell;

a read circuit 42, configured to read data from the memory cell; and a processor 43, configured to judge whether the data read from the memory cell is the test write value and determine that a capacitance-frequency characteristic of the memory cell is abnormal if the data is not the test write value.

In some embodiments, the to-be-tested memory further includes a word line and a bit line that both are electrically connected to the memory cell; and the test circuit is 40 configured to open the word line and alternately write the first write value and the second write value into the memory cell from the bit line at the preset frequency.

In some embodiments, the test circuit 40 includes:

a write sub-circuit, configured to write the first write value into the memory cell; and a timer, configured to control the write sub-circuit to write the second write value into the memory cell, after delaying a preset time from a completion of writing of the first write value; and further configured to control the write sub-circuit to write the first write value into the memory cell again, after delaying a preset time from a completion of writing of the second write value.

In some embodiments, there are a plurality of preset frequencies and the plurality of preset frequencies are different from each other; and each of the preset frequencies is sequentially taken as a current preset frequency, and for each current preset frequency, the test circuit 40 is configured to alternately write the first write value and the second write value into the memory cell at the current preset frequency, the write circuit 41 is configured to write the test write value into the memory cell, the read circuit 42 is configured to read the data from the memory cell, and the processor 43 is configured to judge whether the data read from the memory cell is the test write value, and determine that the capacitance-frequency characteristic of the memory cell is abnormal at the current preset frequency if the data is not the test write value.

In some embodiments, the apparatus further includes:

an input device 44, configured to receive a plurality of preset number of times input by a user, where the plurality of preset number of times are different from each other, where each of the plurality of preset number of times is sequentially taken as a current preset number of times, and for each current preset number of times, the test circuit 40 is configured to alternately write the first write value and the second write value into the memory cell at the preset frequency, where the number of times of alternately writing is the current preset number of times, the write circuit 41 is configured to write the test write value into the memory cell, the read circuit 42 is configured to read the data from the memory cell, and the processor 43 is configured to judge whether the data read from the memory cell is the test write value, and determine that the capacitance-frequency characteristic of the memory cell is abnormal under the current preset number of times if the data is not the test write value.

In some embodiments, the preset number of times is 3 times to 2000 times.

According to the memory test method and the memory test apparatus provided in this specific implementation, a first write value and a second write value are alternately written into a memory cell of a to-be-tested memory at a preset frequency, high-frequency conversion between voltages of capacitor plates in the memory cells are implemented by writing different write values, and then whether the memory cell fails during high-frequency conversion is determined by judging whether a read value is the same as a written test write value, to accurately test a capacitance-frequency characteristic of the to-be-tested memory, which is helpful to repair the failed memory cell in time and improve the yield of memory products.

The foregoing descriptions are merely preferred implementations of the present application. It should be noted that several improvements and modifications may further be made by a person of ordinary skill in the art without departing from the principle of the present application, and such improvements and modifications should also be deemed as falling within the protection scope of the present application.

The invention claimed is:

1. A memory test method, comprising:
providing a to-be-tested memory, wherein the to-be-tested memory comprises a plurality of memory cells;
alternately writing a first write value and a second write value into a memory cell of the memory cells at a preset frequency, wherein the first write value is different from the second write value;
writing a test write value into the memory cell; and
judging whether a data read from the memory cell is the test write value, and determining that a capacitance-frequency characteristic of the memory cell is abnormal at the preset frequency when the data is not the test write value;

wherein the alternately writing a first write value and a second write value into a memory cell of the memory cells at a preset frequency comprises:
performing the following first cyclic step for a plurality of times:
writing the first write value into the memory cell;
writing the second write value into the memory cell, after delaying a preset time from a completion of writing of the first write value; and
performing a next first cyclic step after delaying a preset time from a completion of writing of the second write value.

2. The memory test method according to claim 1, wherein the to-be-tested memory further comprises a word line and a bit line that both are electrically connected to the memory cell; and the alternately writing a first write value and a second write value into a memory cell of the memory cells at a preset frequency comprises:
opening the word line; and
alternately writing the first write value and the second write value into the memory cell from the bit line at the preset frequency.

3. The memory test method according to claim 1, wherein there are a plurality of preset frequencies and the plurality of preset frequencies are different from each other; and the memory test method further comprises:
sequentially taking each of the plurality of preset frequencies as a current preset frequency, and performing the following second cyclic step at each current preset frequency:
alternately writing the first write value and the second write value into the memory cell at the current preset frequency;
writing the test write value into the memory cell; and
judging whether the data read from the memory cell is the test write value, and determining that the capacitance-frequency characteristic of the memory cell is abnormal at the current preset frequency when the data is not the test write value.

4. The memory test method according to claim 1, wherein the memory test method further comprises:
setting a plurality of preset number of times, wherein the plurality of preset number of times are different from each other; and
sequentially taking each of the plurality of preset number of times as a current preset number of times, and performing the following third cyclic step for each current preset number of times:
alternately writing the first write value and the second write value into the memory cell at the preset frequency, wherein a number of times of alternately writing is the current preset number of times;
writing the test write value into the memory cell; and
judging whether the data read from the memory cell is the test write value, and determining that the capacitance-frequency characteristic of the memory cell is abnormal under the current preset number of times when the data is not the test write value.

5. The memory test method according to claim 4, wherein each of the plurality of preset number of times is 3 times to 2000 times.

6. The memory test method according to claim 1, wherein the to-be-tested memory comprises the plurality of memory cells, and the plurality of memory cells are arranged into a memory array; and the memory test method further comprises:

alternately writing the first write value and the second write value into each of the plurality of memory cells at the preset frequency;

writing the test write value into the entire memory array; and judging whether the data read from the memory array is the test write value, and determining that there is at least one memory cell with the abnormal capacitance-frequency characteristic in the memory array when the data is not the test write value.

7. The memory test method according to claim 1, wherein the test write value is 1.

8. The memory test method according to claim 1, wherein the preset frequency is 0.1 MHz to 15 MHz.

9. A memory test apparatus, comprising:
  a test circuit, configured to alternately write a first write value and a second write value into a memory cell of a to-be-tested memory at a preset frequency, wherein the first write value is different from the second write value;
  a write circuit, configured to write a test write value into the memory cell;
  a read circuit, configured to read a data from the memory cell; and
  a processor, configured to judge whether the data read from the memory cell is the test write value and determine that a capacitance-frequency characteristic of the memory cell is abnormal at the preset frequency when the data is not the test write value;
  wherein the test circuit comprises:
    a write sub-circuit, configured to write the first write value into the memory cell; and
      a timer, configured to control the write sub-circuit to write the second write value into the memory cell, after delaying a preset time from a completion of writing of the first write value; and further configured to control the write sub-circuit to write the first write value into the memory cell again, after delaying a preset time from a completion of writing of the second write value.

10. The memory test apparatus according to claim 9, wherein the to-be-tested memory further comprises a word line and a bit line that both are electrically connected to the memory cell; and
  the test circuit is configured to open the word line and alternately write the first write value and the second write value into the memory cell from the bit line at the preset frequency.

11. The memory test apparatus according to claim 9, wherein there are a plurality of preset frequencies and the plurality of preset frequencies are different from each other; and
  each of the plurality of preset frequencies is sequentially taken as a current preset frequency, and for each current preset frequency,
    the test circuit is configured to alternately write the first write value and the second write value into the memory cell at the current preset frequency, the write circuit is configured to write the test write value into the memory cell, the read circuit is configured to read the data from the memory cell, and the processor is configured to judge whether the data read from the memory cell is the test write value, and determine that the capacitance-frequency characteristic of the memory cell is abnormal at the current preset frequency when the data is not the test write value.

12. The memory test apparatus according to claim 9, further comprising:
  an input device, configured to receive a plurality of preset number of times input by a user, wherein the plurality of preset number of times are different from each other, wherein
  each of the plurality of preset number of times is sequentially taken as a current preset number of times, and for each current preset number of times,
    the test circuit is configured to alternately write the first write value and the second write value into the memory cell at the preset frequency, wherein a number of times of alternately writing is the current preset number of times, the write circuit is configured to write the test write value into the memory cell, the read circuit is configured to read the data from the memory cell, and the processor is configured to judge whether the data read from the memory cell is the test write value, and determine that the capacitance-frequency characteristic of the memory cell is abnormal under the current preset number of times when the data is not the test write value.

13. The memory test apparatus according to claim 12, wherein each of the plurality of preset number of times is 3 times to 2000 times.

* * * * *